United States Patent [19]

Janssen

[11] 3,823,354

[45] July 9, 1974

[54] HALL ELEMENT

[75] Inventor: Johannes Hendrikus Hubertus Janssen, Emmasingel, Eindhoven, Netherlands

[73] Assignee: U.S. Philips Corporation, New York, N.Y.

[22] Filed: May 29, 1973

[21] Appl. No.: 364,892

[30] Foreign Application Priority Data

June 1, 1972 Netherlands ........................ 727395

[52] U.S. Cl. ...... 317/235 R, 317/235 H, 317/235 D, 317/235 E

[51] Int. Cl. ........................................... H01l 17/00

[58] Field of Search .................................... 317/235

[56] References Cited

UNITED STATES PATENTS 3,370,185 2/1968 Lindberg ............................ 307/309

*Primary Examiner*—Rudolph V. Rolinec
*Assistant Examiner*—E. Wojciechowicz
*Attorney, Agent, or Firm*—Frank R. Trifari

[57] ABSTRACT

The invention relates to a semiconductor device having a Hall element. In order to reduce the offset voltage between the connection contacts for deriving the Hall signals and in order to increase the stability, the Hall element shows a number of sub-Hall elements which are arranged parallel to each other. The Hall bodies of the sub-Hall elements, viewed on the surface of the semiconductor body, are situated beside each other in the semiconductor body and show different directions of current. The semiconductor body may be constituted by an epitaxial layer of n-type silicon on a substrate of p-type silicon. The Hall element may be manufactured by using methods which are generally known in manufacturing integrated circuits.

9 Claims, 10 Drawing Figures

HALL ELEMENT

Figure 1:
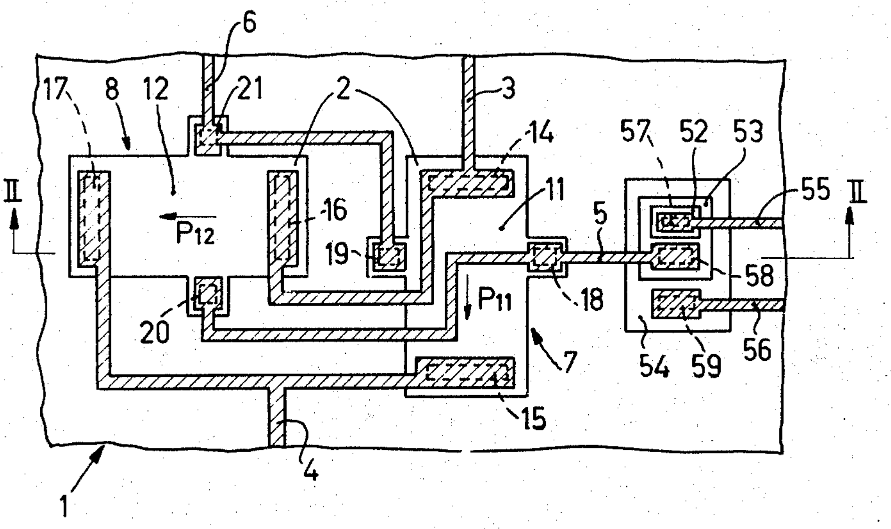

The invention relates to a semiconductor device having a semiconductor body comprising a Hall element with a layer-shaped semiconductor Hall-body which extends substantially parallel to a surface of the semiconductor body, said Hall-body comprising two connection contacts to convey a current laterally through the Hall-body and at least one further connection contact for deriving electric Hall-signals which can be produced laterally transverse to the said direction of current by means of a magnetic field.

Such Hall-elements are known, for example, from the Dutch Pat. application No. 6,712,327 and find a wide field of application. For example, they may be used in commutatorless electric motors in which the electric current through the coil is alternately switched on and switched off by means of electronic circuit elements which are controlled by a Hall-element. Furthermore, such semiconductor devices may be constructed, for example, as amplifier circuits the amplification factor of which can be controlled by means of the Hall-elements, or as contactless switches for, for example, keyboards in which the switch can be switched between the "on-condition" and the "off-condition," for example, by moving the Hall-element relative to a non-homogeneous magnetic field.

Viewed in a direction transverse to a major surface of the semiconductor body, the semiconductor body of the Hall-element usually shows a substantially rectangular shape in which the electrodes for passing the current are provided on two oppositely located short sides of the rectangle.

Although in a number of applications a connection contact for deriving the Hall signal will do, two contacts are provided in most of the cases between which the Hall signal can be derived differentially. In behalf of said connection contacts, the semiconductor body through which the current is conveyed may be provided with laterally projecting parts. As a result of this the full width of the Hall-body may be used for deriving the electric Hall signals. In addition, larger connection contacts for deriving the Hall signal may be provided than when the connection contacts are directly provided on the part of the semiconductor body through which the current is conveyed.

It is known that a quantity which plays an important part in substantially any application of the Hall element is formed by the "offset" of the Hall element. "Offset" is to be understood to mean herein the phenomenon that during operation the voltage difference between the connection contacts for deriving the Hall signal is not equal to zero in the absence of a magnetic field. The offset may be expressed, for example, as the value of said voltage difference. Often, however, the offset is also expressed as the value of the magnetic field in which no voltage is measured any longer between the said connection contacts.

In a larger number of applications said offset is undesired and it will generally be tried to minimize the offset of a Hall element, in particular by providing the connection contacts for deriving the Hall signals as accurately as possible relative to each other. Such an accurate positioning of the connection contacts, however, is found to be insufficient in most of the cases to prevent offset from occurring, as will be described below, so that in general it has to be taken into account that the Hall element shows offset during operation. This means inter alia that in many applications of a Hall element the required magnetic control field should be larger than would be necessary when the Hall element shows no or only a negligibly small offset. It is found that due to the occurrence of offset magnetic fields of even 1,500 Gauss or more are often necessary, it being noted that such strong fields are generally not available without means to obtain extra field concentrations.

One of the objects of the invention is to provide a Hall element which shows no or only a small offset.

The invention is based inter alia on the recognition of the fact that it is possible to obtain Hall elements having offset voltages which are opposite to each other and that a combined Hall effect can be obtained with an at least partially compensated offset voltage by the parallel arrangement of such Hall elements.

It is to be noted that two Hall elements can be arranged in parallel by d.c. connecting the connection contacts for the passage of a current of one Hall element to that of the other Hall element and also by connecting together the contacts for deriving the Hall signals from the Hall elements in such manner that interconnected contacts during operation and with a given magnetic field produce a Hall signal of the same polarity.

The invention is furthermore based on the recognition of the fact that such a compensation is possible in that the offset is caused to a considerable extent by disturbances and non-uniformities in the semiconductor body which are not local but which extend over a comparatively large part of the semiconductor body. Such disturbances and non-uniformities make it possible to provide in a semiconductor body Hall elements the offset voltages of which are opposite to each other as will be described in greater detail hereinafter.

The disturbing influences as a result of which a Hall element during operation in the absence of a magnetic field nevertheless gives a voltage which is unequal to zero can be distinguished into two types. A first type is formed by disturbances which are only very local and are caused, for example, by local crystal defects of the semiconductor body.

A second type of disturbances is formed by disturbances which, as already noted above, extend over a large region of the semiconductor body and manifest themselves, for example, as a gradual variation of the resistance per square in the semiconductor body. Such disturbances are to be understood, for example, non-uniformities in the semiconductor body, such as a gradual variation of the thickness of the semiconductor body or a gradual variation of the doping concentration in the semiconductor body. The influence of said non-uniformities in the semiconductor body on the offset — which is substantially constant insofar as it is caused by said non-uniformities — could be partially reduced, for example, by using during the manufacture of a Hall element an accurate selection of starting material. However, the drawback of such a selection is that the yield of the manufacture may be considerably reduced.

Moreover, the effect of such a selection is adversely influenced in that, in particular during operation of the Hall element, further disturbances of said second type can occur in the semiconductor body and may result in a gradual variation of the resistivity or the resistance per square of the semiconductor material. Such a disturbance with associated gradient in the resistance per square may be caused, for example, by the energy dissipation during operation of the Hall element which may result in a temperature gradient in the semiconductor body.

Important disturbances which extend over a comparatively large part of the semiconductor body and result in a gradual variation of the resistance per square in the semiconductor body may furthermore be caused by stresses and pressure differences in the semiconductor body.

Such pressure differences are introduced, for example, by the envelope which is provided around the semiconductor body at the end of the manufacturing process. Said pressure gradients are generally not constant as a function of time. Since, in addition, as has been found, the pressure sensitivity of a Hall element can be particularly large, the offset as a result of the pressure gradient in the semiconductor body as well as the variations in the offset as a result of pressure variations in the semiconductor body may be particualrly large.

Summarising, it may therefore be established that even in the case in which a substantially homogeneous and uniform semiconductor body is used as a starting body for the manufacture of a Hall element, it is nevertheless likely that disturbances will occur in the semiconductor body which will extend over a comparatively large part of the semiconductor body and which may result in an offset of the Hall signal.

When two Hall elements are provided in a starting body, the offsets of said Hall elements, insofar as they originate from the first type of disturbances, will be uncorrelated. On the contrary, the offsets, insofar as they are caused by the second type of disturbances, will be correlated with each other.

From experiments which have led to the present invention it has furthermore been found that by providing in a semiconductor body Hall elements having different directions of current and by arranging said Hall elements in parallel, a combined Hall element can be obtained having a smaller offset voltage then the individual Hall elements.

This means that the offset of a Hall element is determined to a considerable extent by disturbances which extend over a comparatively large part of the semiconductor body and that compensation of the offset is possible.

Therefore, a Hall element of the type described in the preamble is characterized according to the invention in that, in order to reduce the offset of the Hall element, the Hall element shows a number of parallel arranged sub-Hall elements each having a layer-shaped semiconductor Hall body extending parallel to the said surface of the semiconductor body, the Hall bodies of the sub-Hall elements, viewed on the said surface, being present beside each other, the sub-Hall elements showing different directions of current.

A large number of measurements have proved that both the average value of the offset and the statistic spread in the offset of a Hall element according to the invention is considerably smaller than of known Hall elements which consists only of a single element.

Moreover it has been found that the temperature sensitivity and in particular the pressure sensitivity of a Hall element according to the invention is small so that the stability of such a Hall element is considerably beter than of known Hall elements. As a result of this a magnetic field which is smaller than 1,500 Gauss will do in many applications of the Hall element, for example, in commutatorless motors, which, structurally, has important advantages.

The sub-elements each show contacts for passing the current. Corresponding contacts of the various sub-elements can be connected together, for example, by means of a metal layer which is deposited on a passivating and insulating layer provided on the said surface of the semiconductor body and which is connected to the sub-Hall elements via one or several apertures in said insulating layer and which forms a connection contact for the whole Hall element. However, the contacts may also be connected together externally, that is to say outside the conventional envelope.

Furthermore each sub-element shows at least one but in most of the cases two contacts for deriving Hall signals. In this case, corresponding contacts of the sub-elements may also be connected together both internally and externally.

The offset voltages of the sub-Hall elements will better compensate each other according as the correlation between the disturbances in the Hall bodies of the sub-Hall elements is larger. Therefore, a preferred embodiment of a semiconductor device according to the invention is characterized in that, viewed on the surface of the semiconductor body, the sub-Hall elements are present close together and are separated laterally from each other at most by an intermediate insulation region.

In the case in which these elements are not identical to each other, for example in that the longitudinal distances between the current conveying contacts are different, the contacts for deriving the Hall voltage from the various sub-elements should be provided so that the sub-element at the area of said contacts show substantially the same potential during operation and in the absence of a magnetic field, not counting offset voltages.

It has furthermore been found from measurements of a number of substantially identical Hall elements which are provided in the same semiconductor body and have mutually different current directions that the off-set voltage of a Hall element depends upon the direction of current of the Hall element and that in such manner that the offset as a function of the double of the angle between the direction of current and any axis parallel to the surface of the semiconductor body shows substantially a cosinusoidal or an approximately sinusoidal variation. It has moreover been found that the said cosinusoidal variation generally is beter followed according as the Hall elements are closer together, which also is a reason to arrange the sub-Hall element as close together as possible in a Hall element according to the invention.

It furthermore follows from the described cosinusoidal behaviour of said voltage that for certain values of the angle between the direction of current of a Hall element and the said axis parallel to the surface of the semiconductor body, the offset voltage of the Hall element may be substantially zero. This fact could be used to manufacture a single Hall element of which the offset is substantially equal to zero. In practice, however, this proves to be very difficult, inter alia since the angle between the direction of current and the said axis for which the offset is substantially zero can vary in the course of time.

A preferred embodiment having a very good compensation is therefore characterized in that the sub-elements are substantially equal to each other and show directions of current in which the sum of the cosines of the double of the angles between the direction of current of each of the sub-elements and any axis parallel to the surface of the semiconductor body is substantially equal to zero.

A favourable configuration is characterized in that the Hall element according to the invention comprises a number of sub-Hall elements the directions of current of which are substantially parallel to the main diagonals of a regular polygon of which the number of angles is the double of the said number of sub-Hall elements.

The number of sub-elements into which the Hall element according to the invention is subdivided, can be determined by a number of factors, such as the available volume of the semiconductor body and the maximum energy which may be dissipated. The compensation of the offset will generally be better according as the number of sub-elements will be larger. In particular with a large number of sub-elements the advantage may occur that the off-set of the sub-elements insofar as they are caused by the accidental defects in the crystal lattice can also start averaging each other. However, the energy dissipation may also become high because, in order to obtain a Hall voltage of a given value with a given magnetic field, the current to be conveyed by the Hall element is proportional to the number of sub-elements.

A preferred embodiment of a Hall element according to the invention in which the energy dissipation is minimum is characterized in that the Hall element comprises two sub-elements the directions of current of which are substantially perpendicular to each other.

According to a further preferred embodiment which also shows important advantages, a Hall element according to the invention shows three sub-elements, the directions of current of which mutually enclose angles which are substantially equal to 120°.

It is to be noted that in this embodiment, as also in the preceding embodiment, the sum of the cosines of the double of the angles between the direction of current of each of the sub-elements and any axis parallel to the surface is substantially equal to zero.

The semiconductor body of a Hall element according to the invention may be, for example, a suitable AIII-BV compound, for example indium-antimonide or indium-arsenide. The sub-elements in such a semiconductor body may be formed, for example, in that a groove is etched in the semiconductor body and electrically insulates the parts of the semiconductor body associated with the sub-elements nearly entirely from each other. Furthermore, a layer of silicon which is provided, for example, on a support of insulating material may be used for the semiconductor body.

However, a preferred embodiment of a Hall element according to the invention is characterized in that the semiconductor body comprises a substrate of one conductivity type and an epitaxial layer of the opposite conductivity type provided on the substrate, the Hall bodies of the sub-Hall elements being constituted by an island-shaped part of the epitaxial layer.

As will become apparent hereinafter from the description of the figures, a Hall element according to this embodiment may be manufactured by using methods which are conventionally used for manufacturing integrated circuits. These methods may advantageously be used to manufacture so-called discrete Hall elements in which in addition to the Hall element no further circuit elements are provided in the semiconductor body. In this embodiment, however, the Hall element will be integrated with other circuit elements, for example, transistors, diodes, resistors and capacities to form an integrated circuit. This is of particularly great importance because in many cases the Hall signal has nevertheless to be amplified by an amplifier circuit the circuit elements of which can now be integrated together with the Hall element in a common semiconductor body.

In a simple embodiment, the semiconductor body of the Hall element is constituted by a number of islands in the epitaxial layer, which islands are insulated from each other, are present near each other and each form part of one of the sub-elements. The islands may be insulated from each other in the usual manner by cup-shaped insulation zones of the opposite conductivity type or by a layer-shaped pattern of insulating material, for example, silicon oxide which is inset in the semiconductor body over at least a part of its thickness.

A further preferred embodiment is characterized in that the Hall bodies of the sub-Hall elements of a Hall element according to the invention constitute an island which comprises a number of parts which from a central part of the island extend laterally in the epitaxial layer and which each form part of the Hall body of one of the sub-Hall elements, the central part of the island being common to the Hall bodies of the sub-Hall elements and comprising a likewise common connection contact to convey a current laterally through the Hall bodies of the sub-Hall elements. One of the advantages of the said preferred embodiment is space-saving since in this case not every sub-Hall element in the epitaxial layer should be surrounded entirely by an insulation zone.

Figure 2:
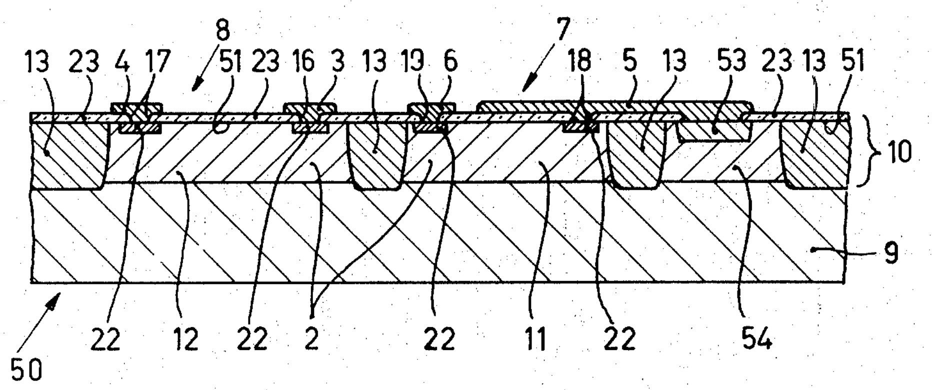
Figure 3:
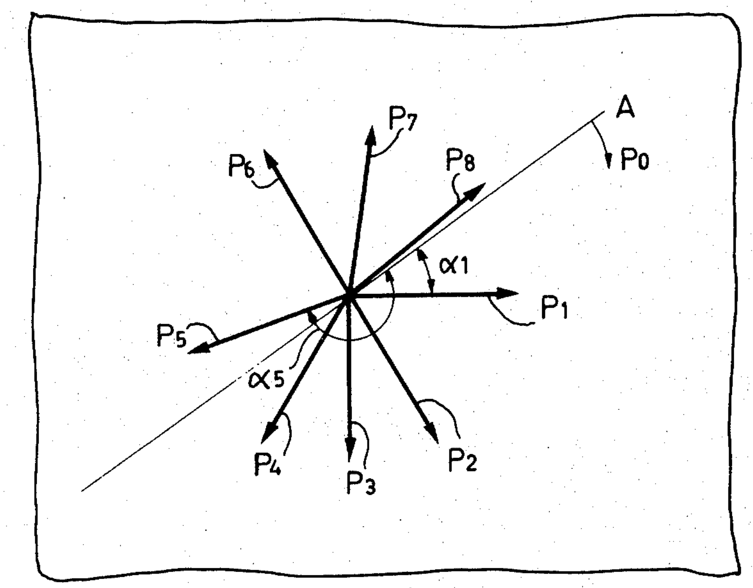
Figure 4:
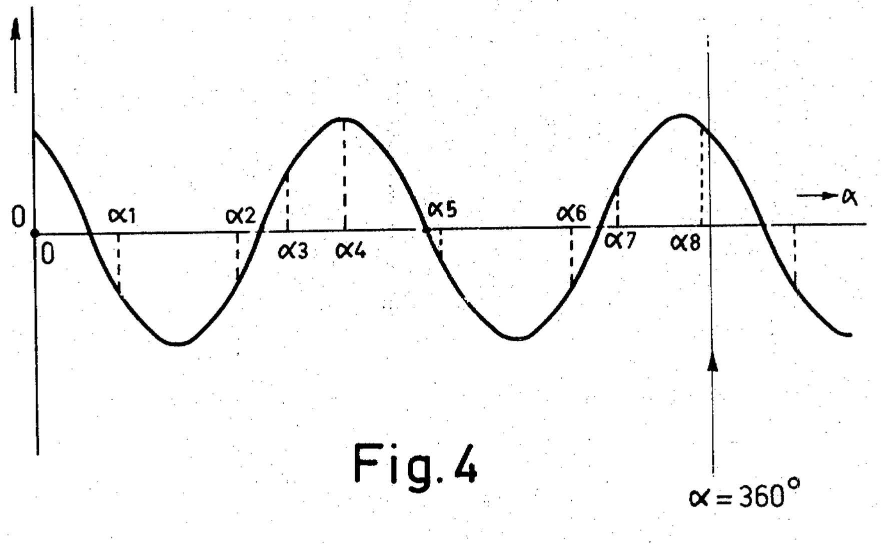
Figure 5:
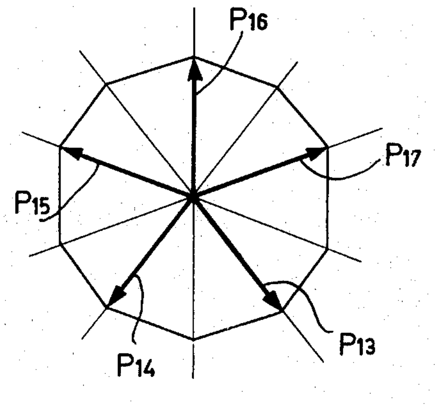

The invention will now be described in greater detail with reference to a few embodiments and the accompanying diagrammatic drawing, in which:

FIG. 1 is a plan view of a part of a semiconductor device comprising a Hall element according to the invention, FIG. 2 is a cross-sectional view of the device shown in FIG. 1 taken on the line II—II of FIG. 1, FIG. 3 is a plan view of a semiconductor body having a number of Hall elements which are shown diagrammatically, FIG. 4 shows the variation of the offset of the Hall elements shown in FIG. 3 as a function of the direction of current, FIG. 5 is a diagrammatic plan view of another semiconductor body having a number of Hall elements which are shown diagrammatically.

Figure 8:
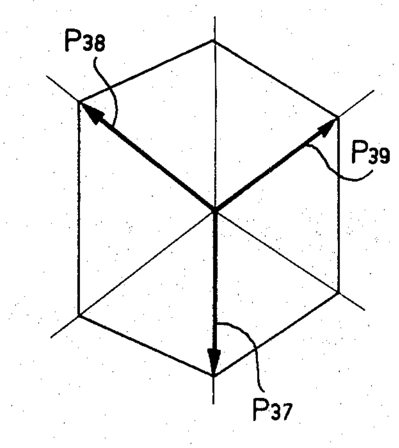
Figure 9:
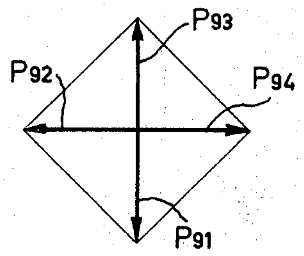
Figure 10:
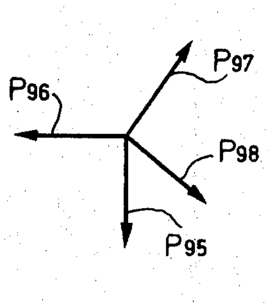
Figure 6:
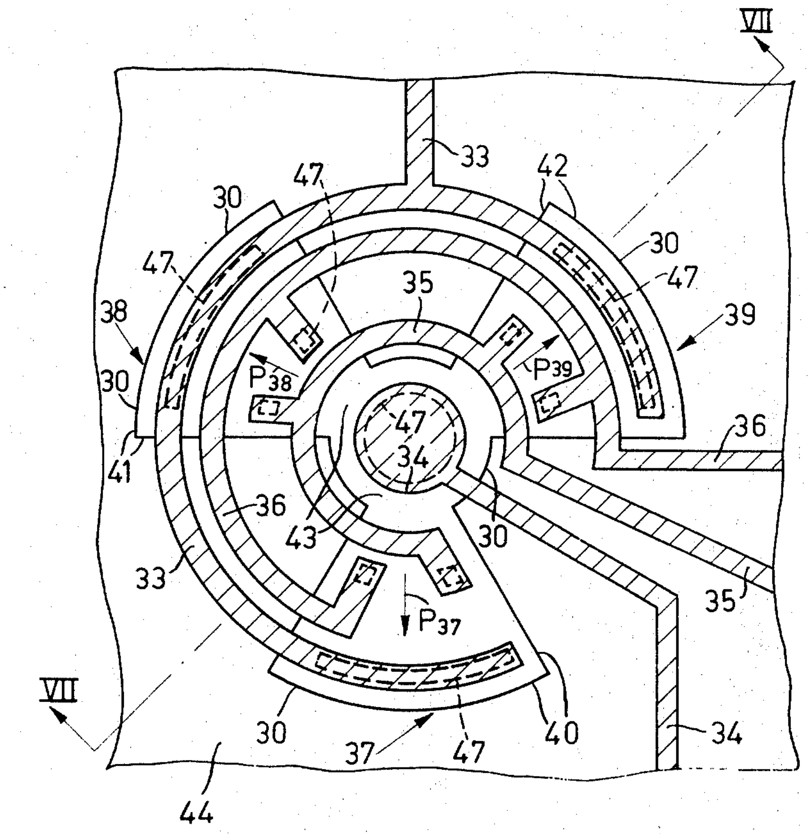
Figure 7:
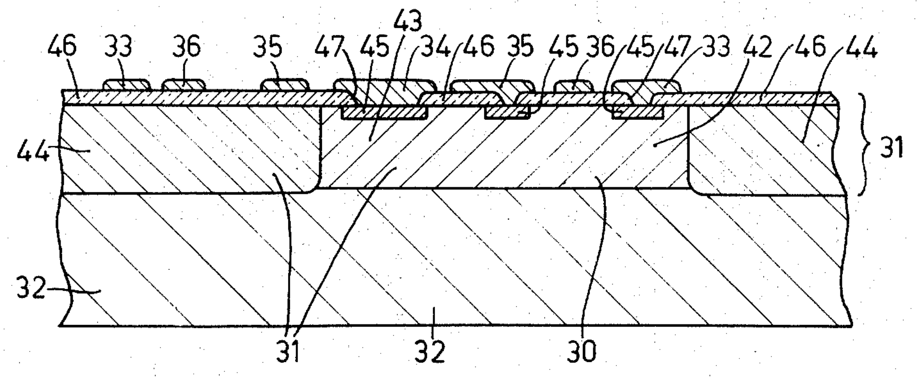

FIG. 6 is a plan variations of a part of another embodiment of a semiconductor device according to the invention, FIG. 7 is a cross-sectional view of the device shown in FIG. 6 taken on the line VII—VII of FIG. 6, FIG. 8 shows a diagrammatic representation of the device shown in FIG. 6, FIG. 9 shows diagrammatically an embodiment of a semiconductor device according to the invention and FIG. 10 shows diagrammatically a further embodiment of a semiconductor device according to the invention.

FIG. 1 is a plan view and FIG. 2 a cross-sectional view of a part of a semiconductor device according to the invention having a semiconductor body 50. The semiconductor body comprises a Hall element 1 having a layer-shaped semiconductor Hall body 2 which extends substantially parallel to a surface 51 of the semiconductor body 50.

The Hall body 2 comprises two connection contacts 3 and 4 to convey a current laterally through the Hall body 2. Connection contacts are to be understood to mean herein all means by which the layer-shaped Hall body 2 can be connected to a current or voltage source. Said means, of which FIG. 1 shows inter alia the connection tracks denoted by 3 and 4, can hence comprise in addition, for example, contact pads by means of which the Hall element can be connected to a voltage source which is present outside the conventional envelope.

The Hall body 2 furthermore comprises at least one, but in the present embodiment two, connection contacts 5 and 6 for deriving the electric Hall signals which can be produced in a lateral direction transverse to the said direction of current by means of a magnetic field perpendicular to the surface 51 of the semiconductor body 50.

In order to reduce the offset of the Hall element, the Hall element 1 comprises a number of parallel arranged sub-Hall elements 7 and 8, in the present example two sub-Hall elements. Said sub-Hall elements each comprise a layer-shaped semiconductor Hall body 11 and 12, respectively, which each extends parallel to said surface 51 of the semiconductor body 50.

VIewed on the said surface 51 of the semiconductor body 50, the Hall bodies 11 and 12 are located beside each other, the sub-Hall elements 7 and 8 showing different directions of current which are denoted by the arrows $P_{11}$ and $P_{12}$.

In the Hall element, disturbances which extend over a comparatively large region of the semiconductor body 50, may cause an offset in each of the sub-Hall elements 7 and 8 individually. Since, however, said offsets will be correlated with each other and since the sub-elements are positioned in the correct manner according to the invention relative to each other, said offsets will compensate each other at least for the greater part, as a result of which an offset can occur only between the connection contacts 5 and 6 for deriving the Hall signals which is considerably smaller than the offsets which can occur in the individual sub-elements 7 and 8.

Since said disturbances in the semiconductor body are in particular a result of the sensitivity to temperature and pressure of the semiconductor material, the Hall element furthermore shows the important advantage that, although the offset voltages of the sub-elements 7 and 8 can vary considerably as a result of pressure or temperature variations, the sensitivity to temperature and pressure of the combination of the parallel arranged sub-elements is considerably smaller than in known single Hall elements.

A Hall element according to the invention has the additional advantage that in many important applications a smaller magnetic field will be sufficient than when a known Hall element is used. In particular when a Hall element according to the invention is used, magnetic fields may often be used which are smaller than 1,500 Gauss, which, structurally, has important advantages since such fields can generally be obtained without means for extra field concentrations.

In the present embodiment the sub-elements 7 and 8 are substantially equal to each other. In this case a good compensation of the offset voltages of the individual sub-elements can be obtained when the sub-Hall elements show directions of current in which the sum of the cosines of the double of the angles between the directions of current of each of the sub-elements and any axis parallel to the surface of the semiconductor body is substantially equal to zero.

This will first be described in greater detail with reference to FIGS. 3, 4 and 5.

FIG. 3 is a plan view of a semiconductor body comprising a number of substantially identical Hall elements which are located close together and are denoted diagrammatically by the arrows $P_1$–$P_8$ denoting the direction of current. Viewed in the direction of rotation denoted by $P_0$, the directions of current $P_1$–$P_8$ form angles $\alpha_1 - \alpha_8$ with any axis A parallel to the surface of the semiconductor body. Of the angles $\alpha_1 - \alpha_8$, FIG. 3 shows only the angles $\alpha_1$ and $\alpha_5$ to avoid complexity of the drawing.

Experiments have demonstrated that the offsets of the individual Hall elements as a function of the double of the angles $\alpha$ show a substantially cosinusoidal variation as is shown in FIG. 4.

Moreover it appears from FIG. 4 that the offset voltages of a number of the Hall elements $P_1 - P_8$ will compensate each other at least for the greater part when the Hall elements are arranged in parallel. For example, the offsets of the Hall elements $P_1$, $P_2$ and $P_4$ or of the Hall elements $P_5$, $P_6$ and $P_8$ or of the Hall elements $P_2$ and $P_3$ will be able to compensate each other for the greater part.

In the case of varitions of the disturbances in the semiconductor body — which generally manifest themselves as a phase variation of the curve shown in FIG. 4 — the offset voltages of, for example, the Hall elements $P_2$ and $P_3$ will vary in such manner that the compensating effect disappears.

FIG. 4 shows, however, that in the case in which any two Hall elements of which the directions of current are substantially perpendicular to each other, are arranged in parallel, the offset voltages of said Hall elements will always compensate each other for the greater part. Such a pair of Hall elements is constituted in FIG. 3 by the Hall elements $P_1$ and $P_3$. Similarly the offsets of three Hall elements, for example, $P_1$, $P_4$ and $P_6$ mutually enclosing angles of approximately 120° will compensate each other for the greater part when said Hall elements are arranged in parallel. Generally it may be said that the offset voltages of Hall elements the directions of current of which are parallel to the main diagonal of a regular polygon of which the number of angles is the double of the number of the Hall elements, will be capable of compensating each other for the greater part. For illustration, FIG. 5 shows diagrammatically five Hall elements $P_{13} - P_{17}$ the directions of current of which are parallel to the main diagonals of a regular decagon and the offset voltages of which, when arranged in parallel, will compensate each other for the greater part as can easily be seen with reference to FIG. 4.

In the embodiment shown in FIGS. 1 and 2 in which two sub-Hall elements are present, the directions of current $P_{11}$ and $P_{12}$ are to the diagonals of a square as can also be easily seen.

In the embodiment to be described here the semiconductor body 50 comprises a substrate 9 of p-type silicon and an n-type epitaxial silicon layer 10 provided on the substrate. The Hall bodies 11 and 12 are constituted by an island-shaped part of the epitaxial layer 10.

As a result of this, the Hall element can be manufactured by means of the conventional planar semiconductor technologies which are used to manufacture integrated circuits.

Moreover, the Hall element in this embodiment may be integrated with other circuit elements, for example, transistors, diodes, resistors and so on, of which for illustration FIGS. 1 and 2 show only a transistor having an emitter zone 52, a base zone 53 and a collector zone 54, the base zone 53 being connected to the contact 5 of the Hall element.

In the present embodiment the Hall bodies 11 and 12 are constituted by islands which are situated close together. These islands are insulated from each other only by an insulation zone 13 which consists of diodes of a semiconductor zone of the same conductivity type as the substrate 9 but which may also be constituted entirely or partly by a zone of insulating material, for example, silicon oxide, which can be obtained by local oxidation of the epitaxial layer 10.

The sub-elements 7 and 8 are arranged in parallel in that the connection contacts 3 and 4 (see FIG. 1) for passing an electric current are contacted to both Hall elements 7 and 8 as well as the contacts 5 and 6 deriving the electric Hall signals. The contacts are formed by metal tracks which are separated from the semiconductor body by an insulating layer 23 of silicon oxide which is provided on the surface 51 of the semiconductor 50. The connection contacts 3 and 4 are contacted with sub-Hall element 7 at the area of the contact apertures 14 and 15 in the insulating layer 23 and with the sub-elements 8 at the area of the apertures 16 and 17. In a corresponding manner, the contacts 5 and 6, for deriving the electric Hall signals are contacted with the sub-Hall element 7 at the area of the apertures 18 and 19 and with the sub-Hall element 8 at the area of the apertures 20 and 21. It is to be noted that the insulating layer 23 is not shown in FIG. 1 and that consequently the contact apertures are denoted by broken lines. Moreover, at the area of the contact windows 14–20 low-ohmic contact zones 22 not shown in FIG. 1 (see FIG. 2) are provided in the epitaxial layer 10 and have the same conductivity type as and a higher doping than the epitaxial layer.

The connection contacts 3 and 4 and 5 and 6, respectively, can be connected to, for example, external supply conductors or, in the case in which the sub-Hall element forms part of an integrated circuit, to other circuit elements as is shown in the present embodiment in which the contact 5 is connected to the base zone 53 of a bipolar transistor the emitter 52 of which is connected to the connection 55 and the collector zone 54 to the connection 56.

Starting material for the manufacture of the device shown in FIGS. 1 and 2 is a p-type substrate 9 of silicon having a thickness of approximately 200 $\mu$ and a resisitivity of approximately 2 ohm.cm.

In a manner conventionally used in semiconductor technology, the n-type epitaxial silicon layer 10 having a thickness of approximately 10 $\mu$m and a resistivity of approximately 0.5 ohm.cm. is provided on the substrate 9.

It is to be noted that several Hall elements or several integrated circuits having a Hall element according to the invention can be manufactured simultaneously in the same semiconductor body and can be subdivided into individual elements or circuits in a later stage of the manufacturing process.

After providing the epitaxial layer 10, the p-type insulation zones 13 are provided by diffusion of boron by means of the conventional photoresist techniques. The insulation zones 13 enclose the islands 11 and 12 and also determine the collector zones 54 of the bipolar transistor (52, 53, 54).

The islands which constitute the Hall bodies 11 and 12 of the sub-Hall elements 7 and 8, viewed in a direction transverse to the surface 51 of the semiconductor body 50, show a substantially rectangular shape the dimensions of which are approximately 100 × 250 $\mu$m. Said islands furthermore comprise laterally projecting parts in behalf of the contacts for deriving the Hall signals.

By means of conventional masking and diffusion or ion implantation methods, the p-type base zone 53 is then provided. If desired, a p-type surface zone may be provided simultaneously with the p-zone 53 in each of the islands 11 and 12 as a result of which the thickness of these bodies 11 and 12 is reduced and hence the resistance increased.

The emitter zone 52, the contact zones 22 and an usual collector contact zone not shown in FIG. 1 either are provided by diffusion of phosphorus. An insulating and passivating layer 23, for example, of silicon oxide, is provided on the epitaxial layer 10 and is provided, at the area of the contact zones 22, with the contact windows 14–21 and with windows 57, 58 and 59 for contacting the emitter zones 52, the base zone 53 and the collector zone 54, respectively, of the transistor.

The connection contacts 3–6 of the Hall element, the emitter contact 55 and the collector contact 56 can be provided simultaneously with further connections, in the conventional manner by depositing aluminium and by means of the usual photoetching methods.

The semiconductor body in which, as is usual, a large number of the described semiconductor devices are manufactured simultaneously, may then be subdivided into individual elements which can be provided in a suitable envelope.

For illustrating the effect of the invention it is to be noted that a large number of measurements has proved that the average value of the offset of the Hall elements of the type described is substantially equal to zero and that the statistic spread in the offset is smaller by a factor 2 to 3 and the pressure sensitivity is smaller by a factor 10 or more than in the individual sub-Hall elements, which means that in a number of applications the required magnetic control fields may be smaller by a factor 3 than when using a sub-Hall element.

Another embodiment of the semiconductor device according to the invention will now be described with reference to FIGS. 6 and 7. The device shown in FIG. 6, a cross-sectional view of which is shown in FIG. 7, comprises a Hall element having a layer-shaped semiconductor Hall body which, like in the preceding embodiments, is constituted by an island-shaped part of an n-type epitaxial silicon layer 31 provided on a p-type silicon substrate 32.

The Hall body 30 comprises two connection contacts 33 and 34 to convey a current laterally through the Hall body 30, and two connection contacts 35 and 36 for deriving the electric Hall signals.

In order to reduce the offset of the Hall element, the Hall element in the present embodiment comprises three parallel-arranged sub-Hall elements 37, 38 and 39, the directions of current of which $P_{37}$–$P_{39}$ are parallel to the diagonals of a regular hexagon as is shown in FIG. 8 and enclose angles with each other which are substantially equal to 120°.

It is to be noted that in this embodiment also the sum of the cosines of the double of the angles between the direction of the current of each of the sub-Hall elements 37 – 39 and any axis parallel to the surface is substantially equal to zero, as can easily be demonstrated.

The sub-Hall elements each show a Hall body in which the Hall bodies of the sub-Hall elements together constitute the island 30 which comprises three parts 40, 41 and 42 which extend, from a central part 43 of the island 30, laterally in the epitaxial layer 31. The parts 40 – 42 form part of the Hall body of one of the sub-Hall elments, the part 40 forming part of the Hall body of the sub-Hall elements 37, the part 41 forming part of the Hall body of the sub-Hall element 38 and the part 42 forming part of the Hall body of the sub-Hall element 39.

The central part 43 of the island 30 is common to the Hall bodies of the sub-Hall elements 37, 38 and 39, so that the sub-Hall element 37 comprises the Hall body (40;43), the sub-Hall element 38 comprises the Hall body (41;43) and the sub-Hall element 39 comprises the Hall body (42;43).

The central part 43 comprises a likewise common connection contact 34 to convey a current laterally through the said bodies (40, 41, 42, 43).

The island 30 is bounded by p-type insulation zones 44 which extend throughout the thickness of the epitaxial layer 31 down to the p-type substrate 32. Furthermore provided in the island 30 are a number of contact zones 45 which have the same conductivity type as and a higher doping than the epitaxial layer 31.

The contact zones 45 are connected in the usual manner, via windows 47 in an insulating and passivating layer 46 of silicon oxide, to the connection contacts 32 – 26 which connect the sub-Hall elements 37, 38 and 39 parallel to each other.

It is to be noted that the oxide layer 46 in FIG. 6 is not shown and that therefore the windows 47 are denoted by broken lines. In addition the contacts 45 are not shown in FIG. 6 to avoid complexity of drawing.

The connection contacts 33 – 36 may furthermore be connected to external supply conductors. However, it is also possible that, for example, only the connection contacts 33 and 34 for passing an electric current are connected to external supply conductors and that the connection contacts 35 and 36 for deriving the electric Hall signals are connected to other circuit elements which, with the Hall elements, constitute an integrated circuit.

FIG. 9 shows diagrammatically a third embodiment of the Hall element according to the invention having four sub-Hall elements which are denoted only by the directions of current $P_{91}$ – $P_{94}$. The embodiment shown in this figure actually constituted a doubling of the embodiment described with reference to FIGS. 1 and 2 and comprises two groups of sub-Hall elements $P_{91}$, $P_{92}$ and $P_{93}$, $P_{94}$ in which the offset voltages of the sub-elements $P_{91}$ and $P_{92}$ compensate each other as well as the offset voltages of the sub-elements $P_{93}$ and $P_{94}$.

In this embodiment a better compensation of accidental errors is inter alia possible than with only two sub-elements the directions of current of which are perpendicular to each other.

In the present embodiment, the directions of current $P_{93}$ and $P_{94}$ enclose angles of 180° with the directions of current $P_{91}$ and $P_{92}$, respectively. The directions of current $P_{93}$ and $P_{94}$, however, may also enclose any angle with the directions of current $P_{91}$ and $P_{92}$, respectively, as is shown in the embodiment shown in FIG. 10.

This embodiment also shows diagrammatically a Hall element having four sub-Hall elements and directions of current $P_{95}$ – $P_{98}$. The directions of current $P_{95}$ and $P_{96}$ are substantially perpendicular to each other, as well as the directions of current $P_{97}$ and $P_{98}$. In this embodiment, however, the directions of current $P_{97}$ and $P_{98}$ constitute any angle unequal to 180° with the directions of current $P_{95}$ and $P_{96}$, respectively. In this case also, however, a better compensation of accidental errors is possible than with only two sub-elements the directions of current of which are perpendicular to each other.

The Hall elements shown in FIGS. 9 and 10 may furthermore be constructed similarly to the Hall elements according to the preceding embodiments.

So far only embodiments have been described in which the offsets of the sub-Hall elements compensate each other maximum. However, structures are also possible in which the offsets of the sub-Hall elements compensate each other for the greater part but not maximum. Such a structure can be obtained, for example, by the parallel arrangement of two sub-Hall elements the directions of current of which are parallel (or opposite) to each other, with a third sub-Hall element the direction of current of which is transverse to the directions of current of the two other sub-Hall elements. On an average, the offset voltages of the sub-Hall elements will compensate each other approximately 70 percent.

It will be obvious that the invention is not restricted to the embodiments described but that many variations are possible to those skilled in the art without departing from the scope of this invention.

For example, instead of a silicon semiconductor body, a semiconductor body consisting of another semiconductor material, in particular an AIII-BV compound, for example, indium arsenide or indium antimonide may be used.

Instead of a substrate of the opposite conductivity type a substrate body of an insulating material may also be used. The insulation zones 13 in FIG. 2 and 44 in FIG. 7 may also be formed by zones of insulating material, for example, silicon oxide, which may be provided by means of local oxidation of the semiconductor body. The resulting oxide layer may extend fully or partly over the thickness of the epitaxial layer.

The conductivity types of the semiconductor regions denoted in this embodiment may be reversed so that n-type zones change into p-type zones, and p-type zones into n-type zones.

The resistance of the Hall body can advantageously be increased, for example, by reducing in the embodiment described in the thickness of the Hall body by means of an p-type surface zone which, the contact places excepted, is provided throughout the surface of the Hall body so that the Hall body extends mainly between the p-type substrate and the p-type surface zone. Such an increase of the resistance may also be obtained by means of a p-type buried layer in which a highly doped p-type surface zone which, during the manufacturing of the semiconductor device extends in the epitaxial layer, is provided in the substrate at the area of the Hall body.

Furthermore in the embodiment described, the sub-elements are permanently connected together in parallel by means of the connection contacts for passing a current and by the connection contacts for deriving the electric Hall signals. However, it will be obvious that the sub-elements may individually be provided with connection contacts which can be connected to external supply wires, in which the sub-elements may be arranged parallel to each other outside or inside the conventional envelope. Instead of metal strips which extend over the insulating layer, the sub-Hall elements may also be connected together by means of wires.

Furthermore, the Hall-bodies of the sub-Hall elements need not necessarily be defined by the island insulation surrounding the Hall-bodies. For example, in the embodiment shown in FIGS. 6 and 7, while the semiconductor device is not further changed, the island insulation 44 which consists of p-type semiconductor material and which laterally separates the parts 40, 41 and 42 from each other, may be replaced by n-type material, so of the same conductivity type as that of the parts 40, 41 and 42, and hence of the Hall-bodies of the sub-Hall elements 37, 38 and 39. So in this case the sub-Hall elements are present collectively in an island, the Hall-bodies of the sub-Hall elements being defined only by the location of the electrodes. Although the electrical properties of such a semiconductor device may be slightly more unfavourable than those of the device shown in FIGS. 6 and 7, the structure is simpler, which may be of advantage in certain circumstances.

What is claimed is:

1. A semiconductor device including a semiconductor body comprising a Hall element, said Hall element comprising a number of sub-Hall elements individually comprising a layer-shaped semiconductor Hall body extending parallel to a surface of said semiconductor body, said Hall bodies being located adjacent each other at said surface, said sub-Hall elements individually comprising first and second connection contacts at their respective Hall bodies to convey current laterally therethrough in certain different respective directions and individually comprising at least one further connection contact for deriving electric Hall signals produced laterally transverse to said respective directions of current by a magnetic field, and said Hall element further comprising means for interconnecting respective ones of said first and second and further connection contacts so as to electrically connect said sub-Hall elements in parallel in order to reduce the offset of the Hall element.

2. A semiconductor device as claimed in claim 1, wherein viewed on the surface of the semiconductor body, said sub-Hall elements are proximate to each other and said semiconductor body comprises an intermediate isolating region disposed between adjacent said sub-Hall elements, said adjacent sub-Hall elements being separated laterally from each other at most by said intermediate insulating region.

3. A semiconductor device as claimed in claim 1, wherein said sub-Hall elements are substantially equal to each other in size and are disposed such that the sum of the cosines of the double of the respective angles between each one of said directions of current of said sub-Hall elements and any axis parallel to said surface of said semiconductor body is substantially equal to zero.

4. A semiconductor device as claimed in claim 3, wherein said sub-Hall elements are disposed such that respective said directions of current are substantially parallel to the main diagonals of a regular polygon whose total number of angles is the double of the said number of said sub-Hall elements.

5. A semiconductor device as claimed in claim 4, wherein said Hall element comprises two sub-Hall elements whose directions of current are substantially perpendicular to each other.

6. A semiconductor device as claimed in claim 4, wherein said Hall element comprises three sub-Hall elements whose directions of current mutually enclose angles which are substantially equal to 120°.

7. A semiconductor device as claimed in claim 1, wherein said semiconductor body comprises a substrate of one conductivity type and an epitaxial layer of the opposite conductivity type provided on the substrate, said Hall bodies of said sub-Hall elements comprising an island-shaped part of the epitaxial layer.

8. A semiconductor device as claimed in claim 7, wherein said Hall bodies define and island portion which comprises a number of parts which extend laterally in the epitaxial layer from a central part of the island and which individually constitute respective parts of said Hall bodies wherein said central part of said island is common to said Hall bodies and said Hall element comprises a common connection contact disposed at said central part to convey a current laterally through the Hall bodies of the sub-Hall elements.

9. A semiconductor device as claimed in claim 7, wherein said epitaxial layer further comprises circuit elements including at least one of transistors, diodes and resistors.

* * * * *

PO-1050
(5/69)

UNITED STATES PATENT OFFICE
CERTIFICATE OF CORRECTION

Patent No. 3,823,354 Dated July 9, 1974

Inventor(s) JOHANNES H. H. JANSSEN

It is certified that error appears in the above-identified patent and that said Letters Patent are hereby corrected as shown below:

In the title page Section [30] change "727395" to

--7207395--.

Signed and sealed this 29th day of October 1974.

(SEAL)
Attest:

McCOY M. GIBSON JR.
Attesting Officer

C. MARSHALL DANN
Commissioner of Patents